United States Patent
Bhuyan et al.

(10) Patent No.: US 11,990,332 B2
(45) Date of Patent: May 21, 2024

(54) METHODS AND APPARATUS FOR DEPOSITION OF LOW-K FILMS

(71) Applicant: Applied Materials, Inc., Santa Clara, CA (US)

(72) Inventors: Bhaskar Jyoti Bhuyan, San Jose, CA (US); Mark Saly, Santa Clara, CA (US); Zhelin Sun, Santa Clara, CA (US); Ning Li, San Jose, CA (US); Mihaela Balseanu, Sunnyvale, CA (US); Li-Qun Xia, Cupertino, CA (US); Yijun Liu, Santa Clara, CA (US); Lin Yang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 292 days.

(21) Appl. No.: 16/637,170

(22) PCT Filed: Aug. 6, 2018

(86) PCT No.: PCT/US2018/045386
§ 371 (c)(1),
(2) Date: Feb. 6, 2020

(87) PCT Pub. No.: WO2019/032457
PCT Pub. Date: Feb. 14, 2019

(65) Prior Publication Data
US 2020/0332415 A1 Oct. 22, 2020

Related U.S. Application Data

(60) Provisional application No. 62/542,746, filed on Aug. 8, 2017.

(51) Int. Cl.
*C23C 16/455* (2006.01)
*C23C 16/36* (2006.01)
(Continued)

(52) U.S. Cl.
CPC ........ *H01L 21/02167* (2013.01); *C23C 16/36* (2013.01); *C23C 16/45525* (2013.01);
(Continued)

(58) Field of Classification Search
None
See application file for complete search history.

(56) References Cited

U.S. PATENT DOCUMENTS

| | | | |
|---|---|---|---|
| 2014/0252432 A1* | 9/2014 | Huang | H01L 21/324 257/288 |
| 2016/0002039 A1* | 1/2016 | Thompson | C01B 21/0828 427/553 |

(Continued)

FOREIGN PATENT DOCUMENTS

| KR | 101042788 B1 | 6/2011 |
|---|---|---|
| KR | 101215033 B1 | 12/2012 |

(Continued)

OTHER PUBLICATIONS

PCT International Search Report and Written Opinion in PCT/US2018/045386 dated Nov. 28, 2018, 10 pages.

*Primary Examiner* — Joseph A Miller, Jr.
(74) *Attorney, Agent, or Firm* — Servilla Whitney LLC

(57) ABSTRACT

Methods and apparatus for forming a conformal SiCON film on a surface are described. A SiCN film is formed on a substrate surface and exposed to a low temperature steam annealing process to form a film resistant to damage by rapid thermal processing or ashing. The film is treated by rapid thermal processing and then subjected to a high temperature anneal to form a film with a low dielectric constant.

16 Claims, 9 Drawing Sheets

(51) Int. Cl.
 *C23C 16/56* (2006.01)
 *H01L 21/02* (2006.01)
 *H01L 21/324* (2006.01)

(52) U.S. Cl.
 CPC ........ *C23C 16/56* (2013.01); *H01L 21/02126* (2013.01); *H01L 21/02211* (2013.01); *H01L 21/0228* (2013.01); *H01L 21/02326* (2013.01); *H01L 21/02337* (2013.01); *H01L 21/324* (2013.01)

(56) References Cited

U.S. PATENT DOCUMENTS

2016/0099143 A1* 4/2016 Yan ................... C23C 16/45542
 438/782
2016/0247717 A1 8/2016 Lin

FOREIGN PATENT DOCUMENTS

| KR | 20140114776 A | 9/2014 |
| WO | 2016111815 A1 | 7/2016 |

\* cited by examiner

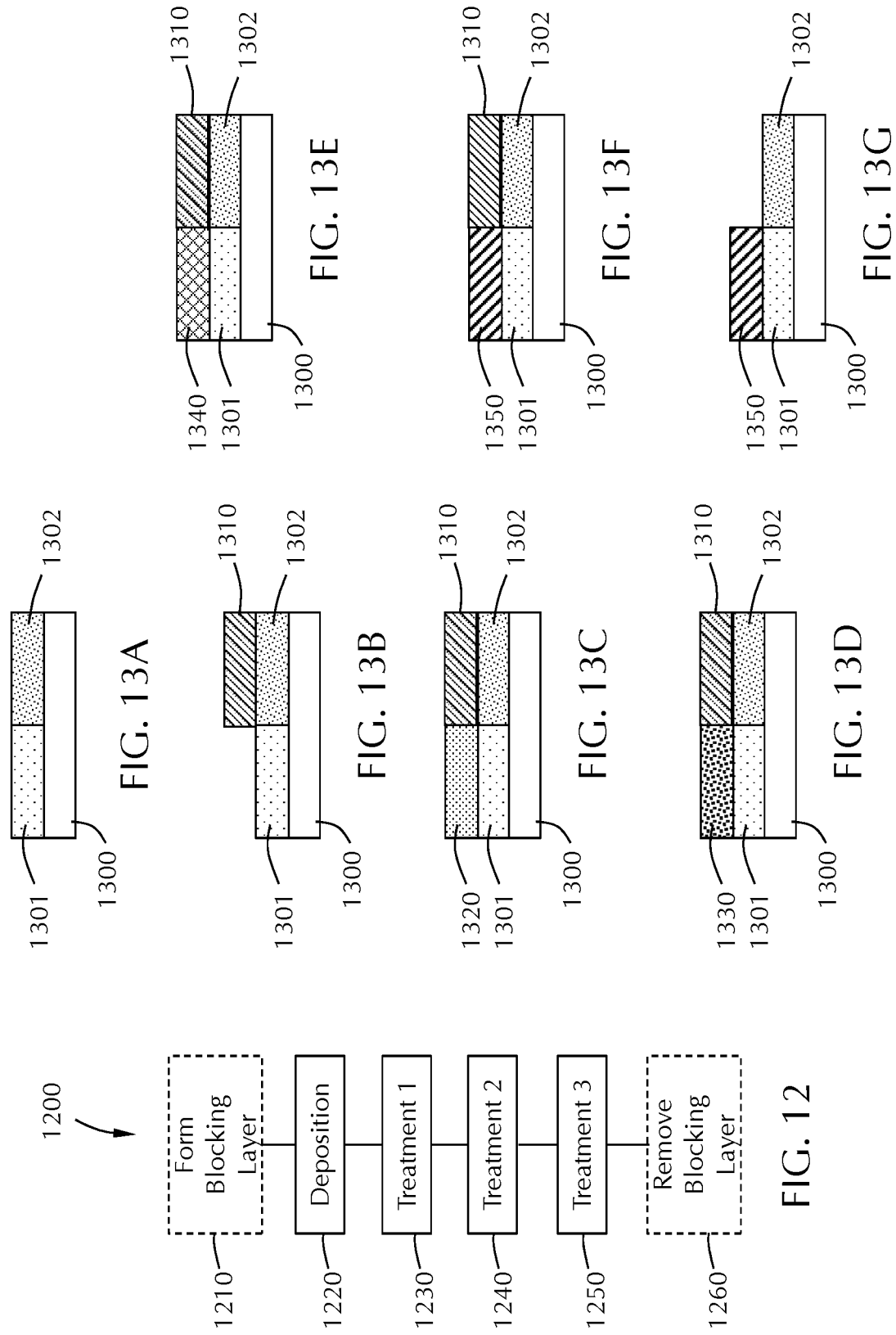

METHODS AND APPARATUS FOR DEPOSITION OF LOW-K FILMS

CROSS-REFERENCE TO RELATED APPLICATIONS

This application is the National Stage entry of PCT/US2018/045386, filed on Aug. 6, 2018, which claims priority to U.S. Provisional Application. Ser. No. 62/542,746, filed Aug. 8, 2017, the entire disclosures of which are hereby incorporated by reference herein.

TECHNICAL FIELD

The present disclosure relates generally to apparatus and methods for depositing thin films. In particular, the disclosure relates to methods for selectively depositing a film using a steam anneal.

BACKGROUND

Integrated circuits are made possible by processes which produce intricately patterned material layers on substrate surfaces. Producing patterned materials on a substrate requires controlled methods for deposition and removal of material layers. Modern semiconductor manufacturing processing applies increasing emphasis on the integration of films without air breaks between process steps. Such a requirement poses a challenge for equipment manufacturers to allow integration of various process chambers into a single tool.

One process that has become popular for deposition of thin films is atomic layer deposition (ALD). Atomic layer deposition is a method in which a substrate is exposed to a precursor which chemisorbs to the substrate surface followed by a reactant which reacts with the chemisorbed precursor. ALD processes are self-limiting and can provide molecular level control of film thicknesses. However, ALD processing can be time consuming due to the need to purge the reaction chamber between exposures to the precursors and reactants.

Selective deposition processes are becoming more frequently employed because of the need for patterning applications for semiconductors. Traditionally, patterning in the microelectronics industry has been accomplished using various lithography and etch processes. However, since lithography is becoming exponentially complex and expensive the use of selective deposition to deposit features is becoming much more attractive.

As device sizes continue to decrease to less than the 10 nm regime, traditional patterning processes using photolithography technology is becoming more challenging. Non-precise patterning and degraded device performance are more prevalent at lower device sizes. Additionally, the multiple patterning technologies also make fabrication processes complicated and more expensive.

Therefore, there is a need in the art for apparatus and methods to selectively deposit a film onto one surface selectively over a different surface.

SUMMARY

One or more embodiments of the disclosure are directed to methods of depositing a film. A substrate having a substrate surface with a plurality of features formed therein is provided. Each feature extends a distance from the substrate surface and having a bottom and at least one sidewall. A conformal film is formed on the substrate surface. The conformal film is exposed to a low temperature steam anneal to form an annealed conformal film. The annealed conformal film is subjected to a treatment comprising one or more of rapid thermal processing or ashing. The annealed conformal film is exposed to a high temperature anneal after treatment to form an annealed low-k film.

Additional embodiments of the disclosure are directed to methods of depositing a film. A substrate having a substrate surface with a plurality of features formed therein is provided. Each feature extends a distance from the substrate surface and having a bottom and at least one sidewall. A conformal film is formed on the substrate surface in an atomic layer deposition chamber by sequentially exposing the substrate to a silicon precursor comprising bis(trichlorosilyl)methane and a reactant comprising ammonia. The conformal film is exposed to a low temperature steam anneal at a temperature less than or equal to about 400° C. and a partial pressure of water of about 585 Torr to form an annealed conformal film. The substrate with the annealed conformal film is exposed to a treatment comprising rapid thermal processing or ashing. The treated film is exposed to a high temperature anneal at a temperature greater than or equal to about 400° C. to form a film having a wet etch rate in dilute HF less than about 20 Å/min for the first minute, a leakage current less than or equal to about $1.5 \times 10{-7}$ A/cm2, and a dielectric constant less than 5.

Further embodiments of the disclosure are directed to methods of depositing a film. A substrate having a substrate surface with a plurality of features formed therein is provided. Each feature extends a distance from the substrate surface and having a bottom and at least one sidewall. A conformal oxidation barrier is formed on the substrate surface. The oxidation barrier comprises silicon carbonitride. A conformal film is formed on the substrate surface in an atomic layer deposition chamber by sequentially exposing the substrate to a silicon precursor comprising bis(trichlorosilyl)methane and a reactant comprising ammonia. The conformal film is exposed to a low temperature steam anneal at a temperature less than or equal to about 400° C. and a partial pressure of water of about 585 Torr to form an annealed conformal film. The substrate with the annealed conformal film is exposed to a treatment comprising rapid thermal processing or ashing. The treated film is exposed to a high temperature anneal at a temperature greater than or equal to about 400° C. to form a film having a dielectric constant less than or equal to about 5.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 12 is a flowchart of a process sequence in accordance with one or more embodiment of the disclosure; and FIGS. 13A through 13G show a schematic representation of a selective deposition method in accordance with one or more embodiment of the disclosure.

Figure 1:
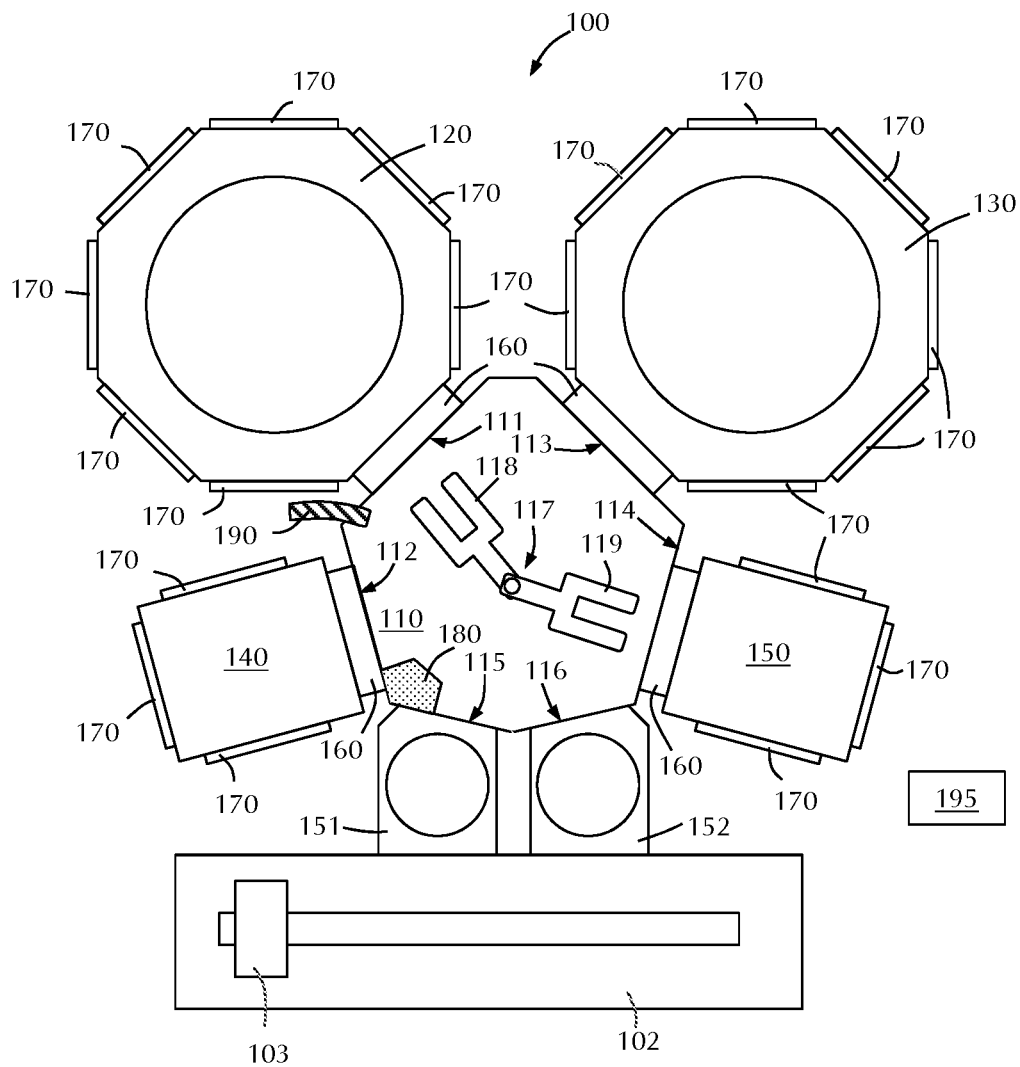
FIG. 1 shows a schematic view of a processing platform in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "wafer" or "substrate" as used herein refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Selective deposition of low-k films is attractive technology for 10 nm and beyond semiconductor fabrication processes. Among other potential applications, low-k spacer layers are highly demanded, which is used to reduce parasitic capacitances between gate and source/drain contacts. Selective deposition means film growth is selective based on the type of substrate surface, for example, film can grow on bare Si surface but not on silicon oxide surface within certain deposition time or target thickness. Selective deposition can avoid or reduce some process steps (e.g., photolithography, etch) to obtain a layer on a pattern structure. Normally, selective deposition uses thermal deposition processes, which is easy to achieve deposition conformality on 3D structures and avoid using reactive plasma species to degrade surface reaction selectivity. However, thermal deposition processes, especially with temperature limits less than 550° C. can barely make films with reasonable properties, air stability, wet etch rate, k value, etc. Accordingly, some embodiments of the disclosure advantageously provide methods of depositing film selectively on Si versus $SiO_2$ surfaces. Some embodiments advantageously provide methods of depositing films with low wet etch rates. Some embodiments advantageously provide methods of depositing films with low-k values.

Embodiments of the disclosure can be used to selectively deposit films or deposit conformal films. One or more embodiments of the disclosure provide methods of forming dielectric films selectively on certain areas of the processing wafer based on the surface terminating chemical groups. Atomic layer deposition (ALD) film growth can be done by traditional time-domain processing or by spatial ALD in a batch processing chamber.

Some embodiments of the disclosure provide methods of forming conformal films on a substrate. A conformal film can be deposited on some or all of the surfaces of the substrate. For example, a conformal film may be deposited on a substrate that has at least one surface feature (e.g., a trench or via). A conformal film has the same thickness at the top of the feature as the bottom of the feature. In some embodiments, the conformality of the film is measured as the thickness at the top of the feature relative to the thickness at the bottom of the feature and is greater than or equal to about 90%, 91%, 92%, 93%, 94%, 95%, 96%, 97% or 98%.

FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The transfer station 110 shown has a first side 111, a second side 112, a third side 113, a fourth side 114, a fifth side 115 and a sixth side 116. Although six sides are shown, those skilled in the art will understand that there can be any suitable number of sides to the transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A batch processing chamber 120 can be connected to a first side 111 of the central transfer station 110. The batch processing chamber 120 can be configured to process x wafers at a time for a batch time. In some embodiments, the batch processing chamber 120 can be configured to process in the range of about four (x=4) to about 12 (x=12) wafers at the same time. In some embodiments, the batch processing chamber 120 is configured to process six (x=6) wafers at the same time. As will be understood by the skilled artisan, while the batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
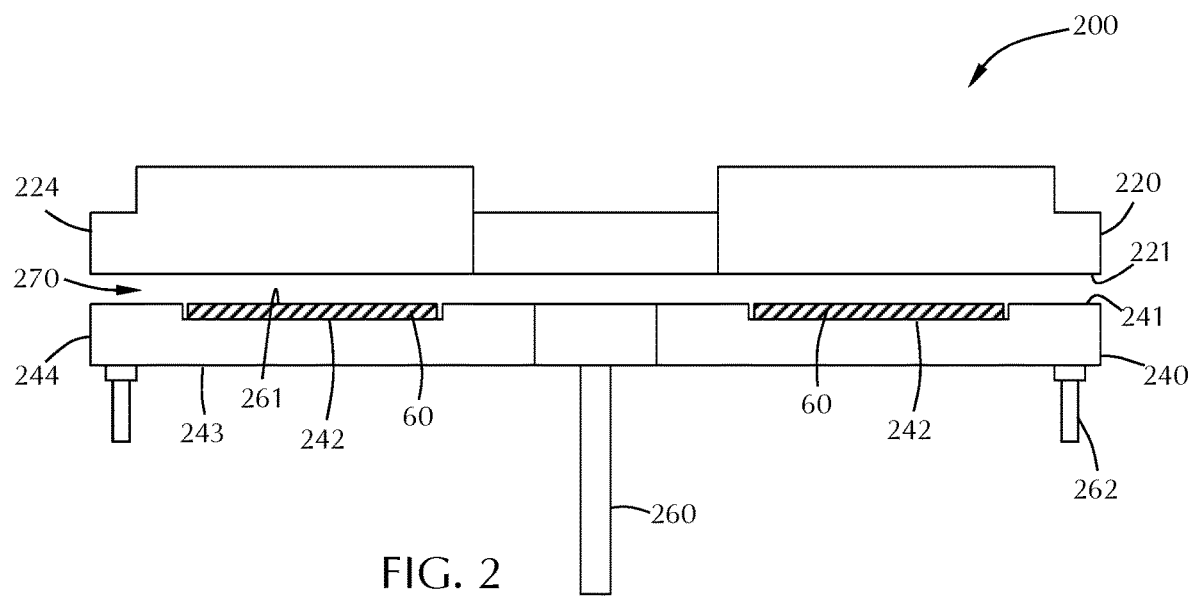
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
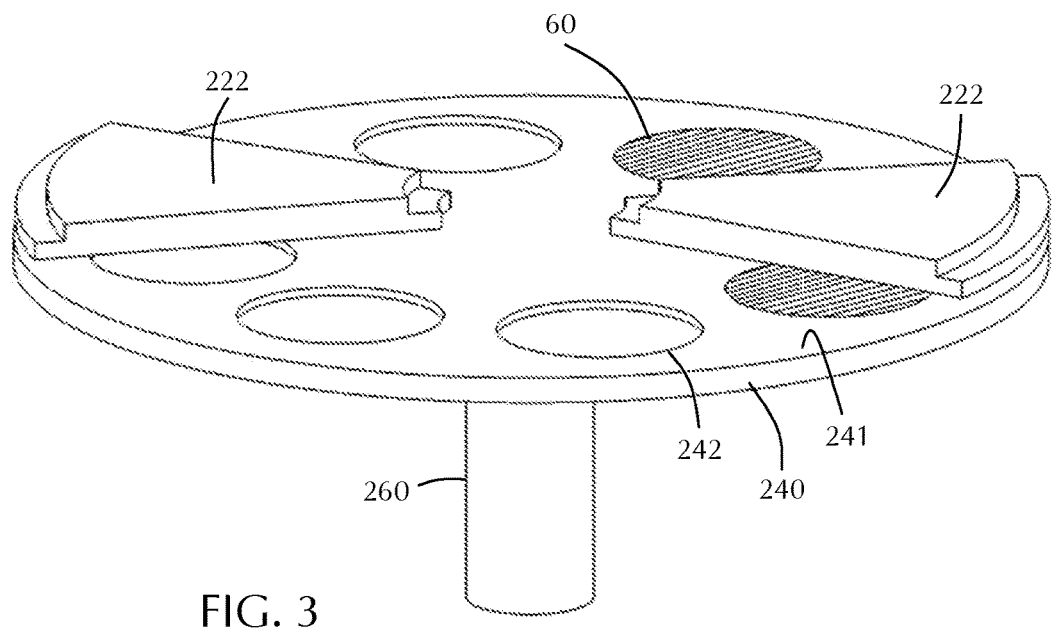
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
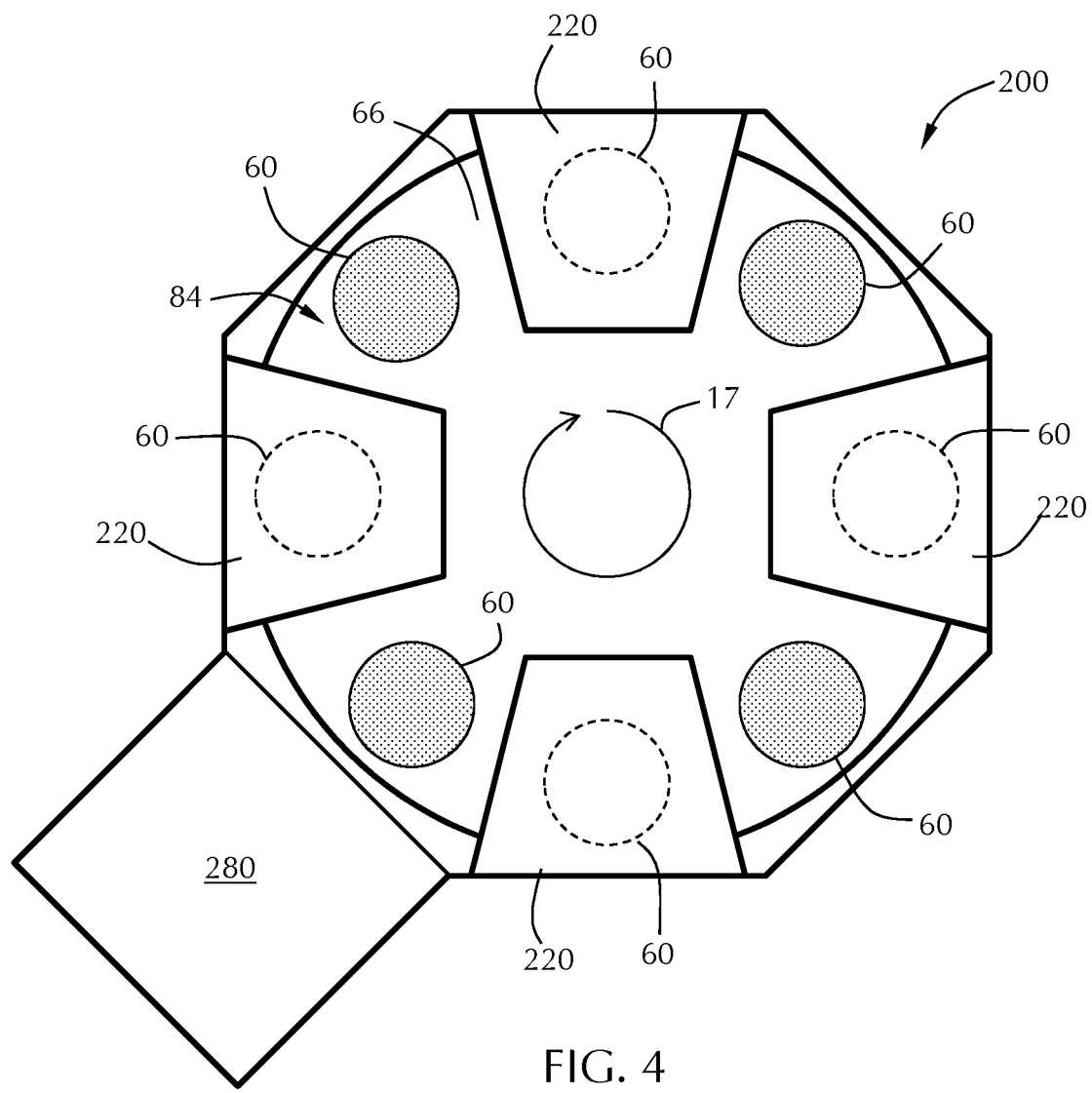
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example the substrates (also referred to as substrates 60) to be loaded/unloaded from the chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 5:
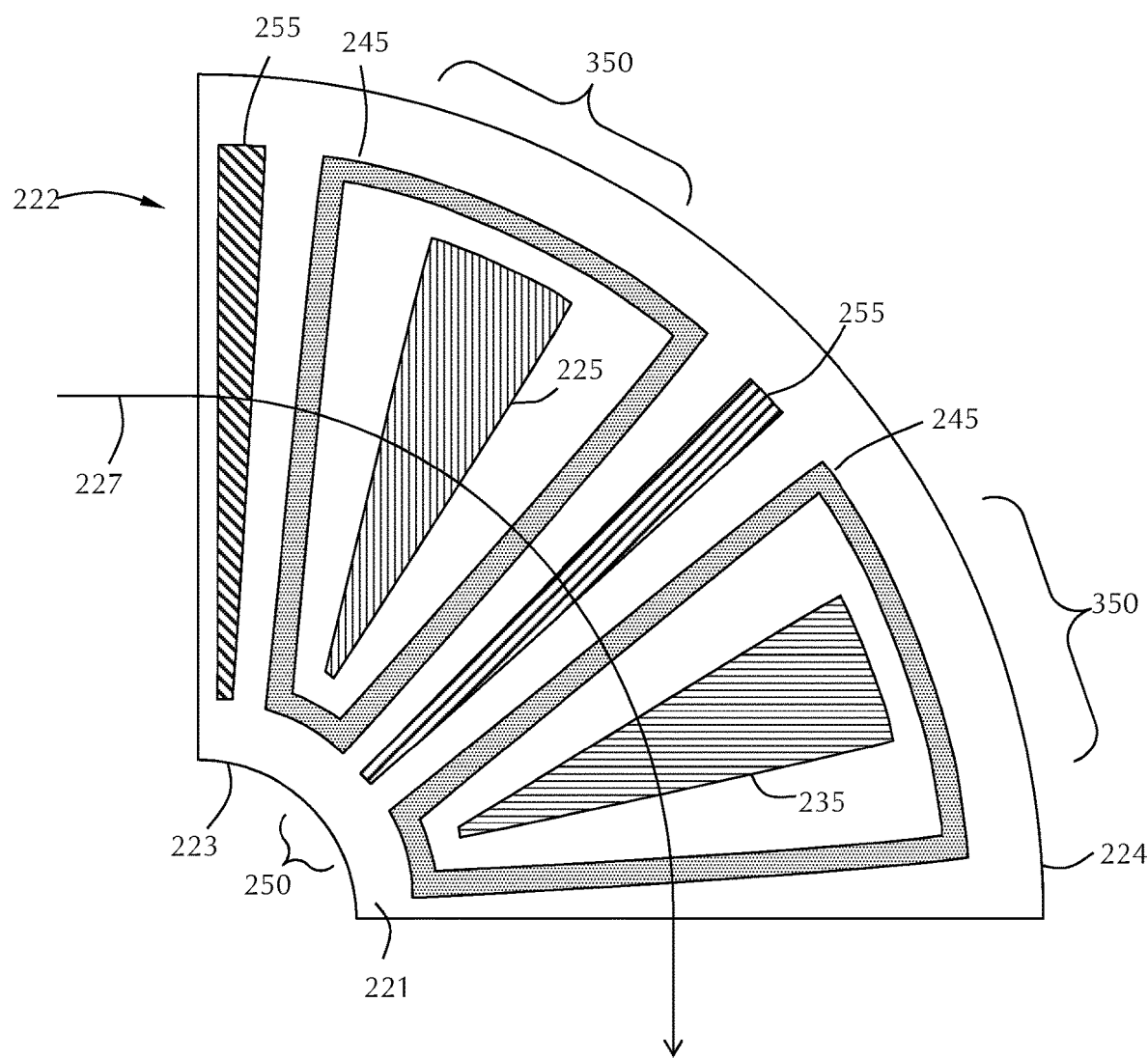
FIG. 5 shows a schematic view of a portion of a wedge shaped gas distribution assembly for use in a batch processing chamber in accordance with one or more embodiment of the disclosure.
Figure 6:
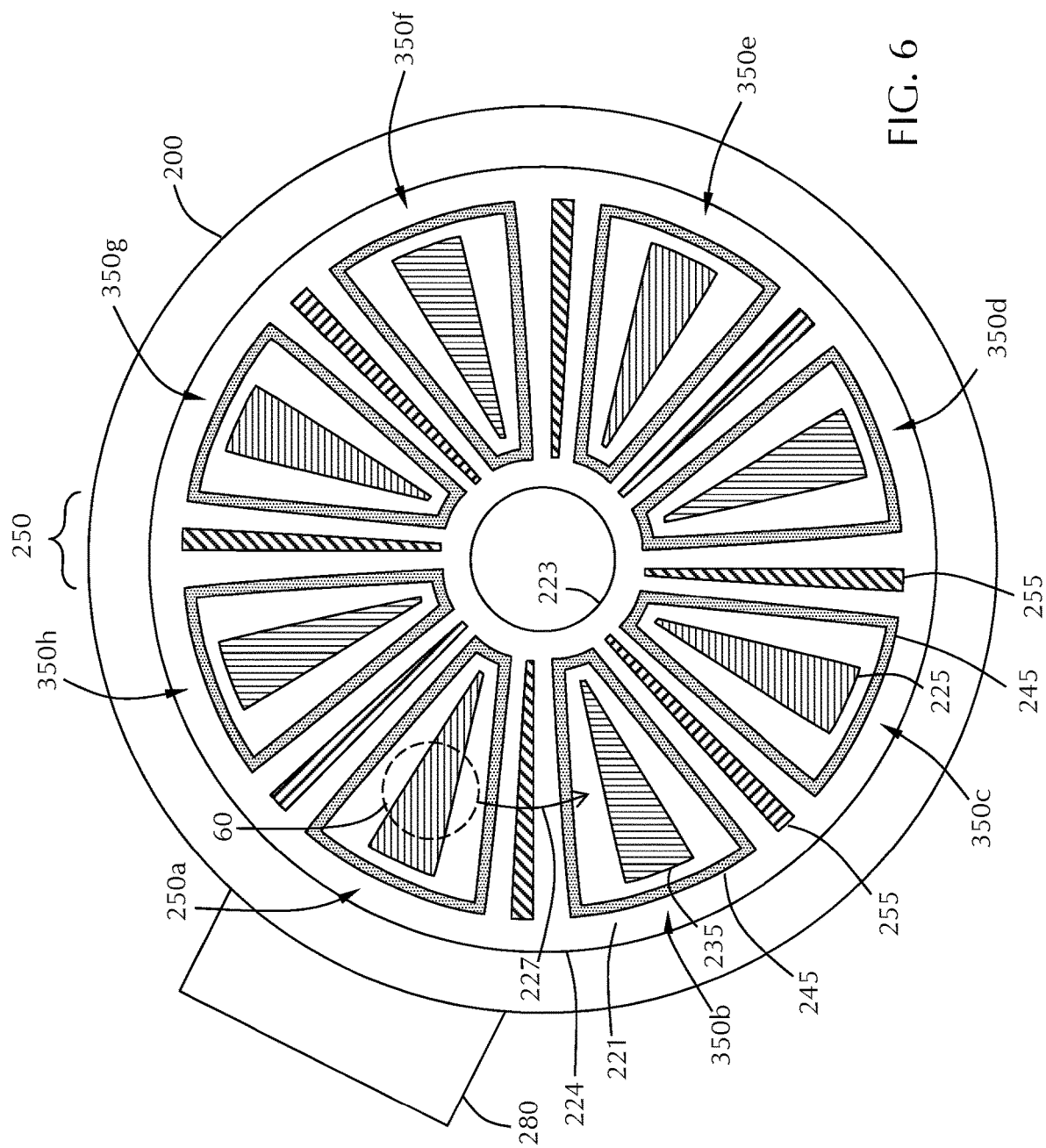
FIG. 6 shows a schematic view of a batch processing chamber in accordance with one or more embodiment of the disclosure.

FIG. 5 shows a sector or portion of a gas distribution assembly 220, which may be referred to as an injector unit 222. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiment may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas 225 and the second reactive gas 235 to form a layer. The injector unit 222 shown makes a quarter circle but could be larger or smaller. The gas distribution assembly 220 shown in FIG. 6 can be considered a combination of four of the injector units 222 of FIG. 4 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface 280 (as shown in FIG. 4), which can be, for example, a load lock chamber, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution plate 220. The substrate 60 is loaded via the factory interface 280 into the processing chamber 200 onto a substrate support or susceptor assembly (see FIG. 4). The substrate 60 can be shown positioned within a process region because the substrate is located adjacent the first reactive gas port 225 and between two gas curtains 250*a*, 250*b*. Rotating the substrate 60 along path 227 will move the substrate counter-clockwise around the processing chamber 200. Thus, the substrate 60 will be exposed to the first process region 350*a* through the eighth process region 350*h*, including all process regions between.

Some embodiments of the disclosure are directed to processing methods comprising a processing chamber 200 with a plurality of process regions 350*a*-350*h* with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350*a*-350*h*.

Referring back to FIG. 1, the processing platform 100 includes a treatment chamber 140 connected to a second side 112 of the central transfer station 110. The treatment chamber 140 of some embodiments is configured to expose the wafers to a process to treat the wafers before and/or after processing in first batch processing chamber 120. The treatment chamber 140 of some embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In some embodiments, the processing platform further comprises a second batch processing chamber 130 connected to a third side 113 of the central transfer station 110. The second batch processing chamber 130 can be configured similarly to the batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second treatment chamber 150 connected to a fourth side 114 of the central transfer station 110. The second treatment chamber 150 can be the same as the treatment chamber 140 or different. In some embodiments, one of treatment chamber 140 or treatment chamber 150 is a rapid thermal processing chamber of an ashing chamber and the other treatment chamber is an annealing chamber.

The processing platform 100 can include a controller 195 connected to the robot 117 (the connection is not shown). The controller 195 can be configured to move wafers between the pre-clean chamber 140 and the first batch processing chamber 120 with a first arm 118 of the robot 117. In some embodiments, the controller 195 is also configured to move wafers between the second single wafer processing chamber 150 and the second batch processing chamber 130 with a second arm 119 of the robot 117.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the treatment chamber 140 and the first batch processing chamber 120 using the first arm 118 of the robot 117. In some embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the transfer chamber 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the platform 100. A robot 103 within the factory interface 102 can be moved the wafers or cassettes into and out of the buffer stations 151, 152. The wafers or cassettes can be moved within the platform 100 by the robot 117 in the central transfer station 110. In some embodiments, the factory interface 102 is a transfer station of another cluster tool.

Embodiments of the disclosure advantageously provide methods to deposit films selectively and/or conformally. One or more embodiments of the disclosure are directed to methods of selectively depositing a film. For example, a film may be deposited on a dielectric surface selectively over a silicon or metal surface. As used in this manner, the phrase "deposited on one surface selectively over a second surface" and the like, means that the subject film is deposited on the first surface to a greater extent than on the second surface. In some embodiments, a film is deposited on a silicon surface selectively over a metal or dielectric surface. In some embodiments, a film is deposited on a metal surface selectively over a silicon or dielectric surface. One or more embodiments of the disclosure are directed to methods to selectively deposit a film that might otherwise benefit from a surface treatment to make the film stable.

Figure 7A:
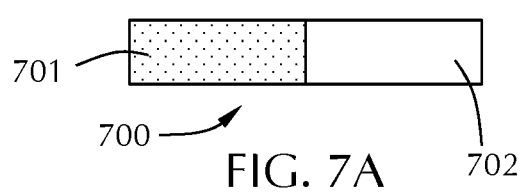
FIGS. 7A through 7C show a schematic representation of a selective deposition method in accordance with one or more embodiment of the disclosure.
Figure 7B:
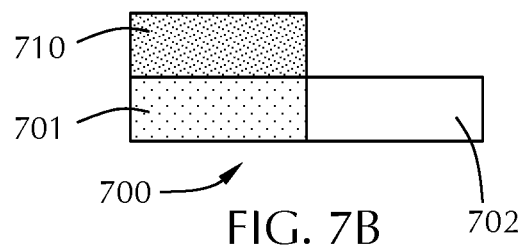
Figure 7C:
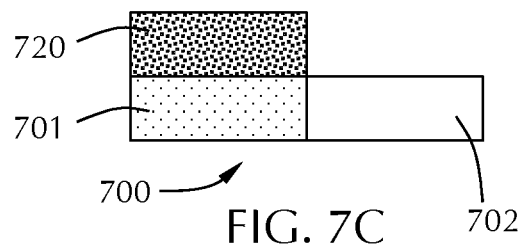

Referring to FIGS. 7A through 7C, a substrate 700 with a first substrate surface 701 and a second substrate surface 702 is provided. The first substrate surface 701 and the second substrate surface 702 can be different materials (e.g., silicon and silicon oxide) or can be the same material with a different surface terminations (e.g., —H and —OH).

In some embodiments, the first substrate surface 701 comprises silicon. In some embodiments, the first substrate surface 701 consists essentially of silicon. In some embodiments, the first substrate surface 701 has hydrogen terminations.

In some embodiments, the second substrate surface 702 comprises silicon oxide. In some embodiments, the second substrate surface 702 consists essentially of silicon oxide. In some embodiments, the second substrate surface 702 has hydroxyl terminations.

The first substrate surface 701 and second substrate surface 702 can be any suitable surfaces for selective deposition. In some embodiments, the first substrate surface 701 comprises a silicon surface with Si—H groups and the second substrate surface 702 comprises a silicon oxide surface with —OH groups with or without native oxide. In some embodiments, the second substrate surface 702 comprises a dielectric surface with —OH ending groups with or without a native oxide and the first substrate surface 701 comprises a metal surface.

If a native oxide is present on either or both of the first substrate surface 701 and the second substrate surface 702, removal of the native oxide may allow for a more effective selective deposition process. Exposing the substrate 700 to an etch process can remove the native oxide from the affected surface. The etch process can be a wet etch process (e.g., exposure to dilute HF (1%)) or a dry etch process (e.g., exposure to a plasma). In some embodiments, the etch process is a plasma-based process. In some embodiments, the plasma-based etch process comprises exposing the substrate to a plasma of ammonia and hydrofluoric acid.

In some embodiments, removing the native oxide from the affected surface provides a surface with substantially only hydrogen terminations. As used in this manner, the term "substantially only hydrogen terminations" means that the surface terminations are hydrogen for greater than or equal to about 98% of the surface area. In some embodiments, removing the native oxide from the surface provides a surface with substantially no oxygen terminations. As used in this manner, the term "substantially no oxygen terminations" means that the surface terminations comprise less than about 2% of the surface area comprises oxygen atoms.

In one or more embodiments, the process used to remove the native oxides from the surface also oxidizes the other surface to provide a surface with substantially no hydrogen terminations. As used in this manner, the term "substantially no hydrogen terminations" means that the surface terminations of the stated surface are hydrogen for less than or equal to about 2% of the surface area.

A film 710 is formed on the first substrate surface 701 selectively over the second substrate surface 702, as illustrated in FIG. 7B. As used in this manner "selectively over" means that the formation or deposition is preferential to the subject surface so that the film forms preferentially on the first substrate surface 701 than on the second substrate surface 702. For example, the film 710 can be formed on the first substrate surface 701 greater than or equal to 20 times, 30 times, 40 times or 50 times thicker than the film is formed on the second substrate surface 702.

Formation of the film 710 can occur by any suitable technique including, but not limited to, atomic layer deposition. In some embodiments, the film 710 is formed in a batch processing chamber, like that shown in FIGS. 2 through 6. For example, the film 710 may be formed by sequential exposure to a silicon precursor and a reactant. The silicon precursor can be any suitable silicon precursor including, but not limited to, silicon halides and organic silicon compounds with or without halogens. In one or more embodiments, the silicon precursor comprises bis(trichlorosilyl)methane. In some embodiments, the silicon precursor comprises more than one silicon atom arranged with at least one carbon separating the silicon atoms. For example, the silicon precursor may have two silicon atoms separated by a methylene unit.

The reactant can be any suitable reactant including, but not limited to, nitrogen contributing species, an oxygen-contributing species and/or a carbon contributing species. In some embodiments, the reactant comprises ammonia.

The film 710 formed is a function of the silicon precursor and the reactant. In some embodiments, the film comprises one or more of SiC or SiCN. In some embodiments, the film formed comprises silicon carbonitride. Those skilled in the art will understand that the designation silicon carbonitride or SiCN does not imply specific stoichiometry; rather merely implying the elements making up the bulk of the film. In some embodiments, the film is doped with one or more of B, As or P in an amount up to about two percent on an atomic basis.

In a batch processing chamber, the substrate can be exposed to the silicon precursor and reactant in alternating process regions of the processing chamber. Referring to FIG. 6, for example, process regions 350a, 350c, 350e, 350g may expose the substrate surface to the silicon precursor and process regions 350b, 350d, 350f, 350h may expose the substrate surface to the reactant, so that each rotation of a substrate around the processing chamber exposes the substrate surface to four cycles of silicon precursor/reactant.

The film 710 thickness can be deposited to a predetermined amount. In some embodiments, the film is deposited to a thickness in the range of about 20 Å to about 500 Å, or in the range of about 200 Å to about 400 Å. In some embodiments, the film is deposited to a thickness greater than or equal to about 50 Å, 100 Å, 150 Å, 200 Å or 250 Å to a thickness less than or equal to about 700 Å, 650 Å, 600 Å, 550 Å or 500 Å. After some time, the film may begin to deposit on the second surface even though a blocking layer or passivating layer may be present (not shown). To increase the thickness of the film and maintain the selectivity, the blocking layer or passivating layer may be replenished periodically.

The film 710 can be formed at any suitable temperature. In some embodiments, the film 710 is formed at a temperature in the range of about 100° C. to about 450° C., or in the range of about 150° C. to about 350° C., or in the range of about 200° C. to about 300° C. In some embodiments, the film is formed by a thermal process without plasma exposure. In some embodiments, the film is formed by a plasma enhanced process.

The film deposited may have film properties that can be optimized or improved by post-deposition processing. For example, a silicon carbonitride film deposited may have a high wet etch rate. Exposing the film to a post-deposition treatment can be used to improve the wet etch rate of the deposited film. In some embodiments, the treatment improves a quality of the film. In some embodiments, the quality of the film improved comprises one or more of the wet etch rate, refractive index, density, hydrogen concentration, leakage current, breakdown voltage, dielectric constant or stress.

The film 710 has a composition that can be changed as part of a treatment process. The change in the film composition may be related to the change in the quality or properties of the film. The film 710 has an initial nitrogen content, an initial oxygen content and an initial carbon content. In some embodiments, the initial oxygen content is substantially zero. As used in this manner, the term "substantially zero" means that the content of the film is less than or equal to about 1%, 0.5% or 0.1% of the stated element (e.g., oxygen) on an atomic basis.

The treatment process of some embodiments comprises exposing the film to a steam anneal process to form an annealed film with at least one property of the film improved after the steam anneal. The steam anneal can occur at any suitable temperature and pressure in any suitable environment. As illustrated in FIG. 7C, the film can be treated with a steam anneal to form an annealed film 720. The annealed film 720 has an annealed nitrogen content, an annealed oxygen content and an annealed carbon content.

In some embodiments, the steam anneal occurs at a substrate temperature in the range of about 150° C. to about 600° C., or in the range of about 200° C. to about 500° C., or in the range of about 250° C. to about 450° C. In some embodiments, the steam anneal occurs at a temperature greater than or equal to about 150° C., 200° C., 250° C., 300° C., 350° C. or 400° C.

In some embodiments, the steam anneal occurs at a pressure in the range of about 20 T to about 100 T, or in the range of about 30 T to about 90 T, or in the range of about 40 T to about 80 T, or in the range of about 50 T to about 75 T. In some embodiments, the pressure of the steam anneal process depends on the process being used.

In some embodiments, the steam anneal occurs in an annealing furnace. The pressure of the anneal furnace in some embodiments is in the range of about 400 T to about 850 T, or in the range of about 450 T to about 800 T, or in the range of about 500 T to about 760 T, or in the range of about 550 T to about 650 T. In some embodiments, the partial pressure of water vapor in the anneal furnace is greater than or equal to about 100 T, 200 T, 300 T, 400 T, 500 T or 600 T. In some embodiments, the partial pressure of water vapor in the anneal furnace is about 585 Torr.

In some embodiments, the steam anneal comprises heating an ampoule containing water and flowing the water vapor from the ampoule to the processing chamber. The ampoule temperature of some embodiments is in the range of about 25° C. to about 80° C., or in the range of about 25° C., to about 70° C., or in the range of about 20° C. to about 50° C. In some embodiments, the ampoule is heated to a temperature greater than or equal to about 30° C., 35° C., 40° C., 45° C., 50° C. or 55° C.

A carrier gas can be passed through the ampoule to bring water vapor to the processing chamber. The carrier gas is generally an inert gas but can also be a reactive gas. In some embodiments, the carrier gas comprises one or more of argon, hydrogen, nitrogen, helium, xenon, krypton, CO, $CO_2$, NO or $NO_2$. The flow rate of the carrier gas in some embodiments is in the range of about 300 sccm to about 5000 sccm, or in the range of about 400 sccm to about 4000 sccm.

In some embodiments, the film formed comprises SiCN and the steam anneal converts the SiCN to SiOC. In some embodiments, the steam anneal process converts substantially all of the SiCN to SiOC. As used in this regard, the term "converts substantially all" means that the bulk composition of greater than or equal to about 90%, 95%, 98% or 99% is converted.

In some embodiments, the annealed film 720 has an annealed nitrogen content that is less than or equal to the initial nitrogen content. In some embodiments, the annealed nitrogen content is less than or equal to about 50%, 40%, 30%, 20% or 10% of the initial nitrogen content. In some embodiments, annealing reduces the nitrogen content to substantially zero. In some embodiments, the annealed nitrogen content is less than or equal to about 1%, 0.5% or 0.1% on an atomic basis.

In some embodiments, the annealed film 720 has an annealed carbon content that is about the same as the initial carbon content. In some embodiments, the annealed carbon content is within ±20%, 15%, 10%, 5%, 2% or 1% of the initial carbon content. The carbon content of the film was expected to be reduced as a result of the steam annealing process. The fact that the carbon content remains about the same after the steam annealing process is unexpected. The annealed carbon content of some embodiments is in the range of about 5% to about 15%, or in the range of about 6% to about 14%, or in the range of about 7% to about 13%, or in the range of about 8% to about 12%, or in the range of about 9% to about 11%, on an atomic basis.

The film can be formed in the same processing chamber as the steam anneal or in different processing chambers. For example, the batch processing chamber of FIG. 6 can be used for both the film formation and steam anneal. In one or more embodiments, the film is formed by sequential exposure to the silicon precursor and the reactant in the different process regions 350. Once the film thickness has been formed, the reactive gases (i.e., silicon precursor and reactant) can be stopped and steam can be flowed into the process regions 350. The susceptor can be stopped or can continue to rotate throughout the anneal process. In some embodiments, the steam anneal occurs in an anneal furnace that is different from the deposition chamber. For example, referring to FIG. 1, the film may be deposited in first batch processing chamber 120 and the steam anneal may occur in an anneal furnace located at treatment chamber 140.

In some embodiments, the properties of the film are improved after the steam anneal. In some embodiments, the wet etch rate (in 1% HF) of the steam annealed film is less than or equal to about 25 Å/min, 20 Å/min, 15 Å/min or 10 Å/min. The wet etch rate is measured at the second full minute of etching (i.e., from 61-120 seconds into the etch process). In some embodiments, the dielectric constant of the steam annealed film is less than or equal to about 6.0, 5.9, 5.8, 5.7, 5.6, 5.5, 5.4, 5.3, 5.2, 5.1, 5.0, 4.9, 4.8 or 4.7.

Figure 8A:
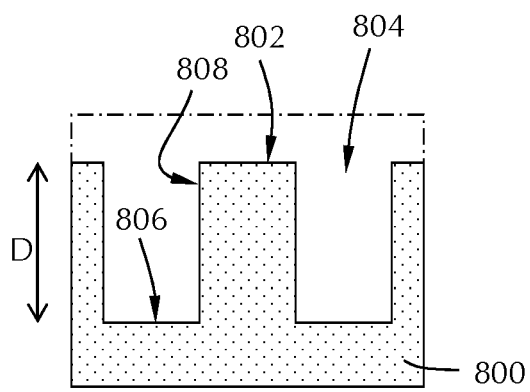
FIGS. 8A through 8E show a schematic representation of a conformal deposition method in accordance with one or more embodiment of the disclosure.
Figure 8B:
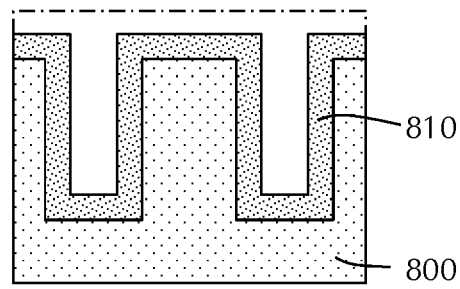
Figure 8C:
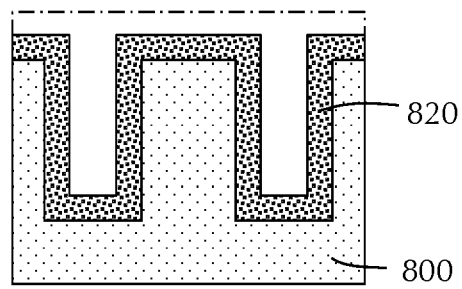

Some embodiments of the disclosure are directed to methods of depositing a conformal film on a substrate. Referring to FIGS. 8A through 8C, a substrate 800 is provided for processing. As used in this regard, the term "provided" means that the substrate 800 is placed into a position or environment to deposit one or more films on the substrate 800. The substrate 800 has a substrate surface 802 with a plurality of features 804 formed therein. Each feature 804 extends a distance D from the substrate surface 802. Each feature 804 has a bottom 806 and at least one sidewall 808. If the feature has a cylindrical shape there is one sidewall 808; however, viewed in cross-section, like that shown in FIG. 8A, would appear to have two sidewalls 808. The number of sidewalls 808 is not limiting to the scope of the disclosure and any shape feature 804 with any number of sidewalls 808 could be used.

The distance D that the feature 804 extends from the surface 802 can be any suitable distance. The ratio of the distance D to the width of the feature 14 is referred to as the aspect ratio. In some embodiments, the feature 14 has a high aspect ratio greater than or equal to about 10:1, 15:1, 20:1, 25:1, 30:1, 35:1, 40:1, 45:1 or 50:1. In some embodiments, the feature has a low aspect ratio less than or equal to about 9:1, 8:1, 7:1, 6:1, 5:1, 4:1, 3:1 or 2:1.

The substrate 800 illustrated in FIGS. 8A through 8C has right angles for the feature 804 formation. Those skilled in the art will understand that this is merely representative of an exemplary embodiment and that features 804 do not necessarily have square corners. The shape of the feature 804 may not have a distinguishable bottom and the sidewall can be angled relative to the substrate surface normal so that a v-shaped trench or via is formed.

The substrate 800 of some embodiments is a portion of a V-NAND device.

The features 804 illustrated are shown as a recess in a unitary material so that the bottom 806 and sidewalls 808 are made of the same material. In some embodiments, the features are formed by alternating layers of different materials so that a first material is shorter than a second material to form the recess shape. In this type of system, the bottom of the feature is formed by the first material and the sidewall of the feature is formed by the taller second material. For example, a V-NAND structure made up of alternating layers of silicon oxide and silicon nitride films.

FIG. 8B shows the substrate 800 after deposition of the conformal film 810. The conformal film has an initial carbon content, an initial oxygen content and an initial nitrogen content. FIG. 8C shows the substrate 800 after steam anneal to form the anneal film 820. The annealed film 820 has an annealed carbon content, an annealed nitrogen content and an annealed oxygen content, as described above.

In some embodiments, the conformal film 810 has a thickness in the range of about 10 Å to about 500 Å. In some embodiments, the conformal film 810 has a thickness in the range of about 20 Å to about 400 Å, or in the range of about 50 Å to about 300 Å, or in the range of about 70 Å to about 200 Å, or in the range of about 80 Å to about 150 Å, or in the range of about 100 Å to about 140 Å, or about 120 Å.

The anneal process was expected to affect the top portion of the film 810 to a greater extent than the lower portions of the film. However, it was surprisingly found that the anneal process affected the film in a uniform manner to depths up to about 300 Å or greater. The annealed conformal film 820 of some embodiments has a substantially uniform composition of carbon, nitrogen and oxygen. As used in this manner, the term "substantially uniform composition" means the composition of the film does not change by more than about 10, 5, 2 or 1% relative as a function of depth in the film. For example, the composition of the film at a depth of 10 Å is substantially uniform with the composition of the film at a depth of about 50 Å.

At this point in the process, the annealed conformal film 820 has been stabilized and the dielectric constant reduced. It was also surprisingly found that the annealed conformal film 820 had an improved resistance to ashing and rapid thermal processing steps that might be performed on the device. Accordingly, some embodiments of the disclosure are directed to methods of increasing the rapid thermal processing and/or ashing resistance of a film.

The dielectric constant and the wet etch rate of the annealed conformal film 820 are generally improved with increased deposition temperature. The resistance to ashing and rapid thermal processing is better with lower temperature deposition. Without being bound by any particular theory of operation, it is believed that Si—$CH_3$ bonds formed in the film contribute to a lower dielectric constant but are unstable at the high temperatures experienced during a rapid thermal processing or ashing procedure. Lower temperature deposition and annealing may result in less Si—$CH_3$, and potentially more Si—$CH_2$—Si, which is believed to provide resistivity to high temperature processes at the cost of a higher dielectric constant.

Accordingly, some embodiments of the disclosure provide a method of forming low dielectric constant and/or low wet etch rate films. In a broad aspect, the method comprises depositing a film at a relatively low temperature followed by a relatively low temperature steam anneal to provide a film that is relatively resistant to ashing or rapid thermal processing. After ashing or rapid thermal processing treatment, the film can be subjected to one or more of a high temperature steam anneal or a high temperature thermal anneal to minimize the wet etch rate and dielectric constant.

The film of some embodiments is a SiCON film and the silicon precursor employed in the deposition process has at least one Si—C bond. In some embodiments, the silicon precursor has at least one Si—$CH_2$—Si bond. In some embodiments, the silicon precursor can convert to form Si—CH$_3$ bonds in the film. In some embodiments, the silicon precursor comprises at least one Si—C bond or multiple silicon atoms connected by at least one carbon atom.

Figure 8D:
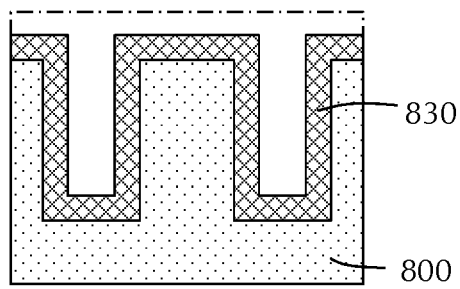
Figure 8E:
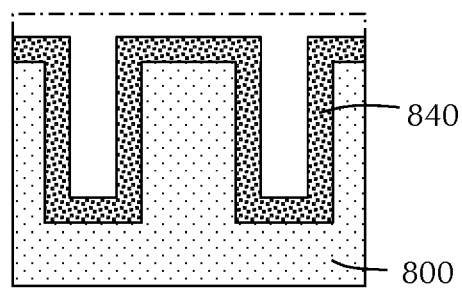

FIG. 8D shows the substrate 800 after ashing or rapid thermal processing to form a treated film 830. The treated film 830 can then be subjected to a high temperature annealing process to form an annealed film 840, as shown in FIG. 8E. In some embodiments, the film 810 is deposited at a temperature less than or equal to about 350° C., the low temperature steam anneal occurs at a temperature less than or equal to about 400° C., and after ashing or RTP, the high temperature anneal occurs at a temperature greater than or equal to about 400° C. The low temperature anneal can be the process employed to generate annealed film 820 and is differentiated from a high temperature anneal that occurs after a subsequent ashing or rapid thermal processing. The high temperature anneal occurs at a temperature that is greater than the low temperature steam anneal. In some embodiments, the high temperature anneal occurs at a temperature greater than or equal to about 10° C., 20° C., 30° C., 40° C., 50° C., 60° C., 70° C., 80° C., 90° C., 100° C., 125° C., 150° C., 175° C. or 200° C. above the temperature of the low temperature steam anneal.

Figure 9:
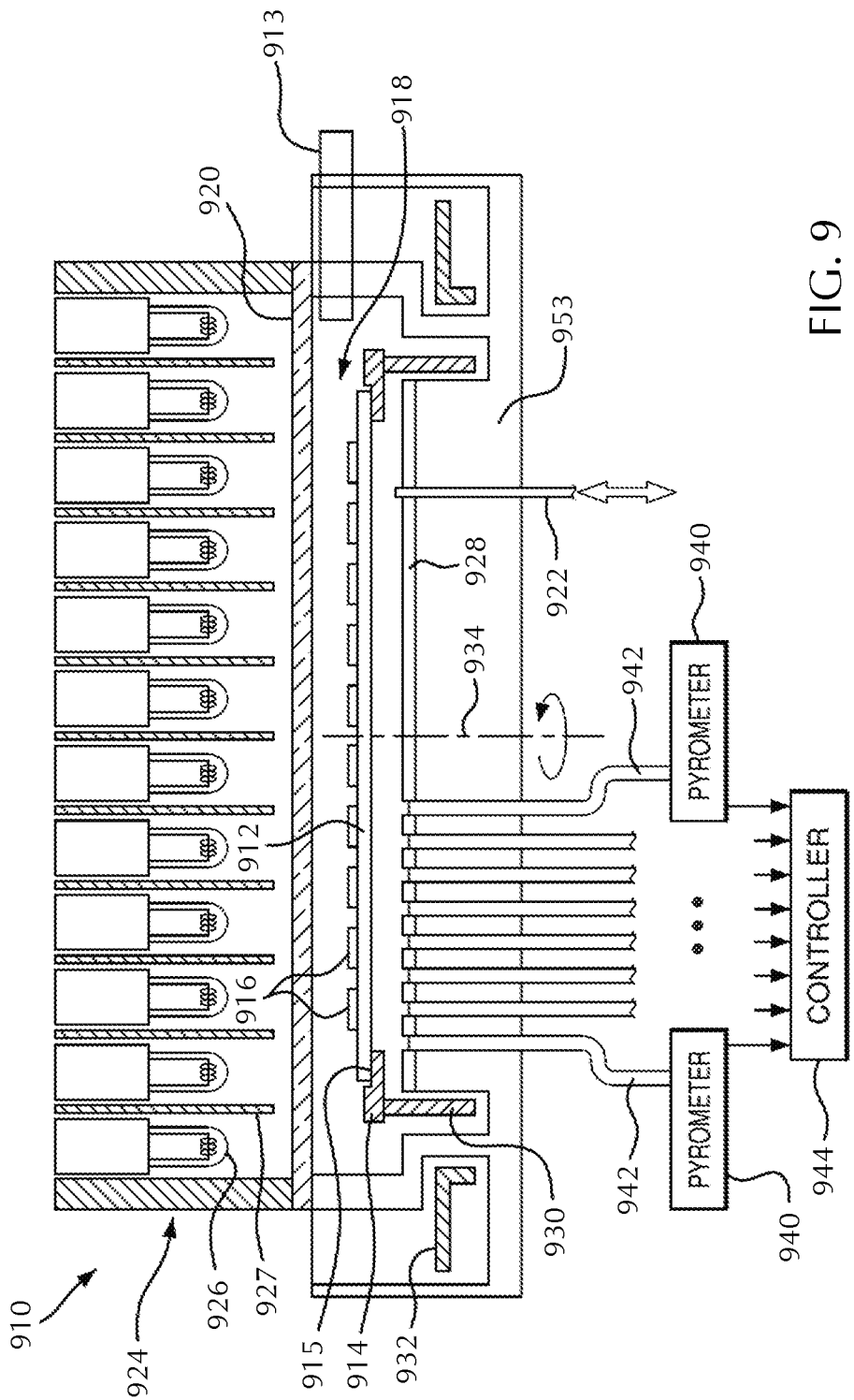
FIG. 9 show a schematic representation of a rapid thermal processing chamber.

The rapid thermal processing (RTP) treatment or process can be performed in any suitable RTP chamber. FIG. 9 schematically illustrates an RTP chamber 910 which may be referred to as a "cold wall reactor" in which the temperature of the walls of the processing chamber is less than the temperature of the substrate being processed. While the brief description of the RTP chamber is made referring to illustrated cold wall reactor, those skilled in the art will understand that the RTP chamber can be a hot wall reactor, have an inverted orientation of lamps-to-substrate, or other variations without deviating from the scope of the disclosure.

In use, the substrate 912 is passed through the valve or access port 913 into the process area 918 of the chamber 910. The wafer 912 is supported on its periphery by a substrate support 914 in the form of an annular edge ring having an annular sloping shelf 915 contacting the corner of the wafer 912. In this configuration RTP chamber, the wafer is oriented such that processed features 916 already formed in a front surface of the wafer 912 face upwardly, referenced to the downward gravitational field, toward a process area 918 defined on its upper side by a transparent quartz window 920. Contrary to the schematic illustration, the features 916 for the most part do not project substantial distances beyond the surface of the wafer 912 but constitute patterning within and near the plane of the surface. Lift pins 922 may be raised and lowered to support the back side of the wafer 912 when the wafer is handed between a paddle or robot blade (not shown) bringing the wafer into the chamber and onto the edge ring type substrate support 914. A radiant heating apparatus 924 is positioned above the window 920 and the substrate support 914 to direct radiant energy toward the wafer 912 and thus to heat it. In the chamber 910, the radiant heating apparatus includes a large number, 409 being an exemplary number, of high-intensity tungsten-halogen lamps 926 positioned in respective reflective hexagonal tubes 927 arranged in a close-packed which extends down and supports the window 920 against internal chamber pressure.

As used herein, RTP refers an apparatus or a process capable of uniformly heating a wafer at rates of about 50° C./second and higher, for example, at rates of 100° C./second to 150° C./second, and 200° C./second to 400° C./second. Typical ramp-down (cooling) rates in RTP chambers are in the range of 80° C./second to 150° C./second. Some processes performed in RTP chambers require variations in temperature across the substrate of less than a few degrees Celsius. Thus, an RTP chamber includes a lamp or other suitable heating system and heating system control capable of heating at rate of up to 100° C./second to 150° C./second, and 200° C./second to 400° C./second distinguishing RTP chambers from other types of thermal chambers that do not have a heating system and heating control system capable of rapidly heating at these rates.

One passive means of improving the temperature uniformity across the wafer 912 includes a reflector 928 extending parallel to and over an area greater than the wafer 912 and facing the back side of the wafer 912. The reflector 928 efficiently reflects heat radiation emitted from the wafer 912 back toward the wafer 912. The spacing between the wafer 912 and the reflector 928 can be in the range of about 3 mm to about 9 mm, and the aspect ratio of the width to the thickness of the cavity may be greater than about 20. The reflector 928, which may be formed of a gold coating or multi-layer dielectric interference mirror, effectively forms a black-body cavity at the back of the wafer 912 that tends to distribute heat from warmer portions of the wafer 912 to cooler portions. In some embodiments, the reflector 928 may have a more irregular surface or have a black or other colored surface to more closely resemble a black-body wall. The black-body cavity is filled with a distribution, usually described in terms of a Planck distribution, of radiation corresponding to the temperature of the wafer 912 while the radiation from the lamps 926 has a distribution corresponding to the much higher temperature of the lamps 926. Preferably, the reflector 928 is deposited on a water-cooled base to heat sink excess radiation from the wafer, especially during cool down.

One way of improving the uniformity includes supporting the edge ring (i.e., substrate support 914) on a rotatable cylinder 930 that is magnetically coupled to a rotatable flange 932 positioned outside the chamber. A motor (not shown) rotates the flange 932 and hence rotates the wafer 912 about its center 934, which is also the centerline of the generally symmetric chamber.

Another way of improving the uniformity divides the lamps 926 into zones arranged generally ring-like about the center 934. Control circuitry varies the voltage delivered to the lamps 926 in the different zones to thereby tailor the radial distribution of radiant energy. Dynamic control of the zoned heating is effected by, a plurality of pyrometers 940 coupled through optical light pipes 942 positioned to face the back side of the wafer 912 through apertures in the reflector 928 to measure the temperature across a radius of the rotating wafer 912. The light pipes 942 may be formed of various structures including sapphire, metal, and silica fiber. A computerized controller 944 receives the outputs of the pyrometers 940 and accordingly controls the voltages supplied to the different rings of lamps 926 to thereby dynamically control the radiant heating intensity and pattern during the processing. Pyrometers generally measure light intensity in a narrow wavelength bandwidth of, for example, 40 nm in a range between about 700 to 1000 nm. The controller 944 or other instrumentation converts the light intensity to a temperature through the well-known Planck distribution of the spectral distribution of light intensity radiating from a black-body held at that temperature. Pyrometry, however, is affected by the emissivity of the portion of the wafer 912 being scanned. Emissivity c can vary between 1 for a black body to 0 for a perfect reflector and thus is an inverse measure of the reflectivity R=1−ε of the wafer back side. While the back surface of a wafer is typically uniform so that uniform emissivity is expected, the backside composition may vary depending upon prior processing. The pyrometry can be improved by further including a emissometer to optically probe the wafer to measure the emissivity or reflectance of the portion of the wafer it is facing in the relevant wavelength range and the control algorithm within the controller 944 to include the measured emissivity.

In the embodiment shown in FIG. 9, the separation between the substrate 912 and the reflector 928 is dependent on the predetermined thermal exposure for the given substrate 912. In one embodiment, the substrate 912 can be disposed at a greater distance from the reflector 928 to increase the amount of thermal exposure to the substrate. In another embodiment, the substrate 912 can be placed closer to the reflector 928 to decrease the amount of thermal exposure to the substrate 912. The exact position of the substrate 912 during the heating of the substrate 912 and the residence time spent in a specific position depends on the desired amount of thermal exposure to the substrate 912.

In another embodiment, when the substrate 912 is in a lower position, proximate the reflector 928, the thermal conduction from the substrate 912 to the reflector 928 increases and enhances the cooling process. The increased rate of cooling in turn promotes optimal RTP performances. The closer the substrate 912 is positioned to the reflector 928; the amount of thermal exposure will proportionally decrease. The embodiment shown in FIG. 9 allows the substrate support 914 to be easily levitated at different vertical positions inside the chamber to permit control of the substrate's thermal exposure.

The ashing process can be performed in addition to rapid thermal processing or in place of the rapid thermal processing. Briefly, ashing comprises exposing the substrate to a plasma. The plasma can include oxygen and/or water vapor. The plasma can be a direct plasma or a remote plasma. The ashing process can occur in any processing chamber that can provide a suitable plasma. For example, the ashing process can occur in the batch processing chamber 120 or in a different chamber.

In some embodiments, the processing platform 100 shown in FIG. 1 includes one or more annealing chambers, one or more rapid thermal processing chambers and one or more batch processing chambers. In some embodiments, the processing platform 100 includes high temperature and low temperature annealing chambers.

Referring again to FIGS. 8D and 8E, after formation of the treated film 830; the treated film 830 can be subjected to an annealing process to form annealed film 840. Annealing the treated film 830 helps to minimize the wet etch rate and dielectric constant of the film post-RTP or ashing. Once the film has been subjected to ashing or rapid thermal processing, the presence of Si—CH$_3$ bonds in the film should not present a limitation for future processes. Thus, the treated film 830 can be annealed at a high temperature.

The high temperature anneal can be a steam anneal or a thermal anneal. As used in this manner, the term "thermal anneal" means an annealing process that has an environment with substantially only inert gases. As used in this manner, "substantially only inert gases" means that there are no gases intentionally included in the annealing chamber that are reactive with the film. The high temperature anneal can occur in the same chamber as the steam anneal or in a different chamber.

In one or more embodiment, the treated film 830 is subjected to a high temperature steam anneal to form the annealed film 840. The high temperature steam anneal can occur at any suitable temperature and pressure in any suitable environment. In some embodiments, the high temperature anneal occurs at a temperature greater than or equal to about 400° C., 425° C. or 450° C. In some embodiments, the high temperature anneal occurs at a substrate temperature in the range of about 100° C. to about 600° C., or in the range of about 200° C. to about 550° C., or in the range of about 300° C. to about 500° C., or in the range of about 400° C. to about 600° C., or in the range of about 450° C. to about 550° C.

In some embodiments, the high temperature anneal includes steam at a pressure in the range of about 400 T to about 850 T, or in the range of about 450 T to about 800 T, or in the range of about 500 T to about 760 T, or in the range of about 550 T to about 650 T. In some embodiments, the partial pressure of water vapor in the anneal furnace is greater than or equal to about 100 T, 200 T, 300 T, 400 T, 500 T or 600 T. In some embodiments, the partial pressure of water vapor in the anneal furnace during the high temperature anneal is about 585 Torr.

In some embodiments, the high temperature steam anneal comprises heating an ampoule containing water and flowing the water vapor from the ampoule to the processing chamber. The ampoule temperature of some embodiments is in the range of about 25° C. to about 80° C., or in the range of about 25° C., to about 70° C., or in the range of about 20° C. to about 50° C. In some embodiments, the ampoule is heated to a temperature greater than or equal to about 30° C., 35° C., 40° C., 45° C., 50° C. or 55° C.

A carrier gas can be passed through the ampoule to bring water vapor to the processing chamber. The carrier gas is generally an inert gas but can also be a reactive gas. In some embodiments, the carrier gas comprises one or more of argon, hydrogen, nitrogen, helium, xenon, krypton, CO, $CO_2$, NO or $NO_2$. The flow rate of the carrier gas in some embodiments is in the range of about 300 sccm to about 5000 sccm, or in the range of about 400 sccm to about 4000 sccm.

In some embodiments, the high temperature anneal is a thermal anneal substantially without reactive gases present in the annealing chamber. In some embodiments, the high temperature thermal anneal has an annealing environment comprising one or more of helium, nitrogen or argon.

In some embodiments, the low temperature steam anneal improves at least some properties of the film. For example, the low temperature steam anneal can improve the wet etch rate or dielectric constant of the film. After ashing or RTP treatment, the high temperature anneal can further improve one or more properties of the film. In some embodiments, the wet etch rate (in 1% HF) of the high temperature annealed film is less than or equal to about 25 Å/min, 20 Å/min, 15 Å/min or 10 Å/min. The wet etch rate is measured at the second full minute of etching (i.e., from 61-120 seconds into the etch process). In some embodiments, the dielectric constant of the high temperature annealed film is less than or equal to about 6.0, 5.9, 5.8, 5.7, 5.6, 5.5, 5.4, 5.3, 5.2, 5.1, 5.0, 4.9, 4.8 or 4.7.

Figure 10A:
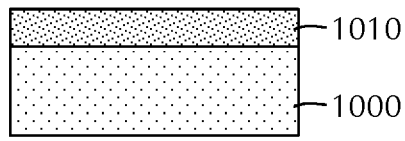
FIGS. 10A and 10B show a schematic representation of oxidation of a substrate by a steam annealing process in accordance with one or more embodiment of the disclosure.
Figure 10B:
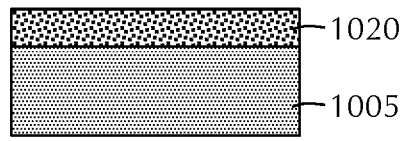

Some embodiments of the disclosure are directed to methods of depositing a low dielectric constant film on an oxidizable surface. FIG. 10A illustrates a substrate 1000 with a film 1010 formed thereon. The film 1010 can be subjected to a steam annealing process, either low temperature or a high temperature, to decrease the dielectric constant of the film. As shown in FIG. 10B, the annealing process can form a annealed film 1020 with improved parameters but may also form an oxidized substrate 1005. Without being bound by any particular theory of operation, it is believed that this may occur as a result of oxygen diffusion through the film 1010 from the steam annealing process. If the substrate 1000 were readily oxidizable under the conditions of the steam annealing process, the oxidized substrate 1005 can result. For example, a tungsten substrate 1000 may be oxidized through the film 1010 to tungsten oxide.

Figure 11A:
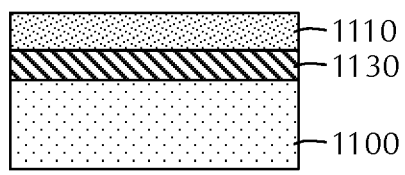
FIGS. 11A and 11B show a schematic representation of an oxidation barrier to prevent substrate oxidation by steam annealing in accordance with one or more embodiment of the disclosure.
Figure 11B:
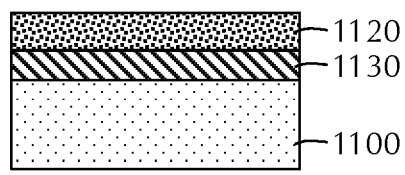

FIGS. 11A and 11B illustrate an embodiment of the disclosure in which an oxidation barrier 1130 is formed on the substrate 1100 prior to deposition of the film 1110. Without being bound by any particular theory of operation, it is believed that the oxidation barrier 1130 will trap oxygen or moisture during the anneal process. The oxidation barrier 1130 can be a low-k material and may combine with or add to the properties of the annealed film 1120.

The oxidation barrier 1130 of some embodiments comprises silicon and one or more of nitrogen or carbon. In some embodiments, the oxidation barrier comprises silicon carbonitride. In some embodiments, the oxidation barrier 1130 is a conformal film. In some embodiments, the oxidation barrier 1130 is formed by an atomic layer deposition using sequential exposures to a silane (e.g., dichlorosilane) and a reductant (e.g., ethanolamine) followed by an optional plasma treatment (e.g., hydrogen plasma). The oxidation barrier 1130 of some embodiments is formed at a temperature in the range of about 300° C. to about 600° C., or in the range of about 400° C. to about 500° C., or about 450° C. In some embodiments, the oxidation barrier 1130 is formed at the same temperature as the film 1110.

The thickness of the oxidation barrier 1130 can be any thickness suitable to prevent oxygen diffusion to the substrate 1100. In some embodiments, the oxidation barrier 1130 has a thickness in the range of about 10 Å to about 30 Å.

Some embodiments of the disclosure provide methods of selectively depositing a film that might benefit from a treatment to improve film stability. FIG. 12 shows a method 1200 in accordance with one or more embodiment of the disclosure. FIGS. 13A through 13G show schematic representations of a substrate processed according to the method 1200 of FIG. 12. The process illustrated by FIGS. 12 and 13A through 13G form a final film with an improved property (e.g., low dielectric constant).

A substrate 1300 can be provided that includes a first surface 1301 and a second surface 1302, as shown in FIG. 13A. The first surface 1301 and the second surface 1302 may have different surface terminations (e.g., —H and —OH) or may have different compositions (e.g., dielectric and metal). The subject film can be deposited on one of the first surface 1301 or the second surface 1302 selectively over the other of the first surface 1301 and the second surface 1302. The embodiment illustrated shows the film being selectively deposited on the first surface 1301 relative to the second surface 1302; however, those skilled in the art will recognize that this is merely one possible configuration and should not be taken as limiting the scope of the disclosure.

At optional step 1210, a blocking layer 1310 can be formed on one of the surfaces. In the embodiment illustrates, blocking layer 1310 is formed on the second surface 1302. The blocking layer 1310 can be any suitable layer that prevents, minimizes or increases the incubation delay for deposition on the blocked surface. For example, a self-assembled monolayer (SAM) may be formed on the second surface 1302 which prevents deposition.

The use of a blocking layer may depend on, for example, the first surface 1301 and second surface 1302, the film being deposited, the deposition conditions, etc. In some embodiments, the blocking layer 1310 is not included on either the first surface 1301 or the second surface 1302.

At step 1220, a film 1320 is formed on the unblocked or selected surface. In the embodiment illustrated in FIG. 13C, the film 1320 is formed on the first surface 1301 and not on the second surface 1302 which has blocking layer 1310. The film can be any suitable film as discussed herein.

At step 1230, the film 1320 is subjected to a first treatment to form a first treated film 1330, as shown in FIG. 13D. The first treatment can be any suitable treatment including, but not limited to, plasma exposure, annealing, UV exposure. In an exemplary embodiment, the first treatment is a low-temperature steam anneal, as described herein. The low temperature steam anneal can occur at any temperature in the range of about 100° C. to about 600° C. In some embodiments, the low temperature steam anneal occurs at a temperature less than or equal to about 400° C.

At step 1240, the first treated film 1330 is subjected to a second treatment to form a second treated film 1340, as shown in FIG. 13E. The second treatment can be any suitable treatment including but not limited to, plasma, UV exposure or annealing. In an exemplary embodiment, the second treatment comprises one or more of a rapid thermal processing treatment or an ashing treatment, as described herein.

At step 1250, the second treated film 1340 is subjected to a third treatment to form a third treated film 1350, as shown in FIG. 13F. The third treatment can be any suitable treatment including, but not limited to, plasma, UV exposure or annealing.

In an exemplary embodiment, the third treatment comprises annealing. In some embodiments, the third treatment comprises one or more of steam annealing or thermal annealing. In some embodiments, the third treatment comprises a steam anneal followed by a thermal anneal. In some embodiments, the third treatment comprises a thermal anneal followed by a steam anneal.

In an exemplary embodiment the first treatment comprises a steam anneal and the third treatment comprises one or more of a steam anneal or a thermal anneal. In certain embodiments the first treatment comprises a steam anneal performed at a temperature in the range of about 100° C. to about 600° C. and the third treatment comprises a steam anneal and/or a thermal anneal at a temperature in the range of about 100° C. to about 600° C. In some embodiments, the temperature of the third treatment is greater than or equal to the temperature of the first treatment. In some embodiments, the first treatment and the third treatment are both steam anneals. In some embodiments, the first treatment and the third treatment are different anneals (i.e., steam or thermal).

At optional step 1260, the optional blocking layer 1310 can be removed, as shown in FIG. 13G, to leave a selectively deposited and treated film 1350 on the first surface 1301 (or second surface 1302). The blocking layer 1310 can be removed by any suitable technique and reaction depending on, for example, the blocking layer 1310 composition.

Referring to FIG. 1, the controller 195 of some embodiments has one or more configurations or executable programs stored on a readable medium. In some embodiments, the controller 195 includes one or more of circuits, a processor, input/output devices, transitory memory (i.e., random access memory), non-transitory memory (i.e., hard disk drive) and/or connections to the hardware components. In some embodiments, the controller 195 has at least one configuration selected from a first configuration to move a substrate to the batch processing chamber, a second configuration to provide a plurality of process gases to the batch processing chamber to deposit a film on the substrate in the batch processing chamber, a third configuration to move a substrate from the batch processing chamber to the steam annealing chamber, a fourth configuration to heat the steam annealing chamber to an annealing temperature, a fifth configuration to provide a flow of water vapor to the steam annealing chamber, a sixth configuration to remove the substrate from the steam annealing chamber; or a seventh configuration to move the substrate to a rapid thermal processing chamber; or an eight configuration to move the substrate to an ashing chamber, or a ninth configuration to rapid thermally process the substrate, or a tenth configuration to ash the substrate, or an eleventh configuration to perform a low temperature steam anneal, or a twelfth configuration to perform a high temperature steam anneal, or a thirteenth configuration to perform a high temperature thermal anneal, or a fourteenth configuration to perform deposition of an oxidation barrier layer. The configurations can include any commands or functions to control flow rates, gas valves, gas sources, rotation, movement, heating, cooling, or other processes for performing the various configurations.

Examples

Silicon carbonitride films were deposited on silicon substrates by sequential exposure to bis(trichlorosilyl)methane and ammonia. The SiCN film was exposed to a steam anneal process. About 340 Å of SiCN was deposited followed by a one hour anneal at 500° C., 75 T, 600 sccm water ampoule push flow. The effect of water ampoule temperature on the film properties are listed in Table 1.

TABLE 1

|  | No Anneal | 25° C. | 40° C. | 50° C. | 60° C. |
| --- | --- | --- | --- | --- | --- |
| Thickness (Å) | 349.4 | 338.9 | 345.5 | 344.9 | 347.8 |
| Refractive Index | 1.673 | 1.608 | 1.577 | 1.575 | 1.574 |
| Stress (MPa) | −186 | −37 | −100 | −42 | −42 |
| WER (Å/min) | 35.0 | 24.7 | 13.9 | 10.6 | 8.0 |
| Leakage (A/cm$^2$) | 2.0e−6 | 1.5e−6 | 6.7e−8 | 5.2e−8 | 4.4e−8 |
| Breakdown Voltage (MV/cm) | 11.0 | 8.6 | 11.6 | 11.8 | 12.2 |
| Dielectric constant (k) | 6.3 | 5.6 | 4.8 | 4.7 | 4.6 |

The wet etch rate and dielectric constant were observed to decrease with increased water dose (i.e., higher ampoule temperature). The wet etch rate was measured as the second full minute of exposure to the etchant (1% HF).

SiCN films were deposited and exposed to a furnace anneal under different conditions to form an SiOC film. Results are listed in Table 2.

TABLE 2

|  |  | In-situ Anneal* | Furnace Anneal | | |
| --- | --- | --- | --- | --- | --- |
| Conditions | No Anneal N/A | 450° C. 60 min 22.5 Torr | 300° C. 30 min 585 Torr | 450° C. 30 min 585 Torr | 500° C. 30 min 585 Torr |
| Thickness (Å) | 109.6 | 111.5 | 113.3 | 118.2 | 120.5 |
| Refractive Index | 1.592 | 1.527 | 1.518 | 1.459 | 1.444 |
| WER (Å/min) | 33.5 | 19.5 | 5.8 | 2.0 | 1.5 |
| Leakage (A/cm$^2$) | 6.1e−7 | 1.4e−7 | 1.0e−7 | 2.6e−8 | 2.2e−8 |
| $V_{bd}$ (MV/cm) | 14.5 | 13.6 | 14.1 | 15.4 | 14.9 |
| Dielectric (k) | 5.5 | 4.8 | 4.9 | 4.1 | 3.7 |

*In-situ anneal occurred in the same batch processing chamber as deposition.

The atomic composition of the films SiOC films are listed in Table 3.

TABLE 3

| Film | Atomic Concentration (%) | | | |
| --- | --- | --- | --- | --- |
|  | Silicon | Carbon | Oxygen | Nitrogen |
| In-Situ Anneal | 40.7 | 12.8 | 25.8 | 20.2 |
| 300° C. Furnace | 41.5 | 10.7 | 34.4 | 13.0 |
| 450° C. Furnace | 42.8 | 9.6 | 37.9 | 9.8 |
| 500° C. Furnace | 37.7 | 10.0 | 47.1 | 5.1 |

The SiCON composition was studied using samples prepared with different steam annealing temperature. Silicon oxycarbonitride films were deposited on silicon substrates by sequential exposure to bis(trichlorosilyl)methane and ammonia. Steam annealing was performed for about 30 minutes at 585 torr. The effect of steam annealing temperature on the film properties are listed in Table 4.

TABLE 4

|  | 250° C. anneal | 450° C. anneal |
| --- | --- | --- |
| Thickness (Å) | 194.8 | 357.6 |
| Refractive Index | 1.464 | 1.530 |
| WER (Å/min) | 0.5 | 1.3 |
| Leakage (A/cm$^2$) | 1.3e−7 | 7.4e−9 |
| $V_{bd}$ (MV/cm) | 12.5 | 13.4 |
| Dielectric (k) | 5.0 | 4.1 |

Infrared spectroscopy of the films showed that increasing the anneal temperature increased the amount of Si—CH$_3$, decreased the amount of Si—CH$_2$—Si, increased N—H, decreased k and slightly increased WER.

The effect of deposition temperature and RTP treatment was studied on SiCON films. Silicon oxycarbonitride films were deposited on silicon substrates by sequential exposure to bis(trichlorosilyl)methane and ammonia. Steam annealing was performed and a rapid thermal processing treatment was performed. The RTP treatment spiked the temperature of the substrate to about 1050° C. for less than five seconds. The results are collected in Table 5.

TABLE 5

| | Sample A | | Sample B | |
| --- | --- | --- | --- | --- |
| | 450° C. deposition 500° C. anneal 30 minutes | Post-RTP | 250° C. deposition 450° C. anneal 30 minutes | Post-RTP |
| Thickness (Å) | 392.4 | 341.1 | 194.8 | 163.8 |
| Dielectric (k) | 3.5 | 5.6 | 5.0 | 4.6 |
| WER (Å/min) | 1.3 | 14.0 | 0.5 | 3.7 |
| Carbon (%) | 15 | 8 | 11 | — |
| N/O/Si (%) | 6/47/33 | 3/55/34 | 1/52/34 | — |

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a film, the method comprising:
providing a substrate having a substrate surface with a plurality of features formed therein, each feature extending a distance from the substrate surface and having a bottom and at least one sidewall;
forming a conformal film on the substrate surface, the conformal film formed comprises SiCN;
exposing the conformal film to a low temperature steam anneal to form an annealed conformal film to convert the SiCN to SiOC, the annealed conformal film having a carbon content within ±20% of a carbon content of the conformal film before the low temperature steam anneal;
subjecting the annealed conformal film to a treatment comprising one or more of rapid thermal processing or ashing; and
exposing the annealed conformal film to a high temperature anneal after treatment to form an annealed low-k film, wherein the low temperature steam anneal occurs at a temperature less than or equal to about 400° C., wherein the conformal film has a thickness in the range of about 10 Å to about 500 Å,
wherein the annealed conformal film has a substantially uniform composition of carbon, nitrogen and oxygen to a film thickness up to about 300 Å, the term "substantially uniform composition" means the composition of the film does not change by more than about 10% relative as a function of depth in the film, and
wherein the high temperature anneal occurs at a temperature greater than or equal to about 400° C., and wherein the low-k film has a dielectric constant less than 5.

2. The method of claim 1, wherein the conformal film formed comprises SiCN having an initial carbon content, an initial nitrogen content and an initial oxygen content.

3. The method of claim 2, wherein the low temperature steam anneal increases the oxygen content of the annealed conformal film.

4. The method of claim 1, wherein the high temperature anneal occurs at a temperature greater than or equal to about 50° C. higher than the low temperature steam anneal.

5. The method of claim 1, wherein the annealed conformal low-k film has a wet etch rate in dilute HF less than about 20 Å/min for the first minute.

6. The method of claim 5, wherein the annealed conformal low-k film has a leakage current less than or equal to about $1.5 \times 10^{-7}$ Å/cm$^2$.

7. The method of claim 1, wherein forming the conformal film comprises sequentially exposing the substrate to a silicon precursor and a reactant.

8. The method of claim 7, wherein the silicon precursor comprises a compound having at least two silicon atoms linked by at least one carbon atom.

9. The method of claim 1, wherein the high temperature anneal is a high temperature steam anneal.

10. The method of claim 1, wherein the high temperature anneal is a high temperature thermal anneal.

11. The method of claim 1, wherein the conformal film is deposited at a temperature of about 250° C., and the high temperature anneal occurs at a temperature that is at least about 10° C. greater than the low temperature steam anneal.

12. The method of claim 7, wherein the silicon precursor comprises bis(trichlorosilyl)methane and the reactant comprises ammonia.

13. The method of claim 11, wherein the low temperature steam anneal occur with a partial pressure of water greater than or equal to about 500 Torr.

14. The method of claim 13, wherein the high temperature anneal is a steam anneal.

15. A method of depositing a film, the method comprising:
providing a substrate having a substrate surface with a plurality of features formed therein, each feature extending a distance from the substrate surface and having a bottom and at least one sidewall;
forming a conformal film on the substrate surface in an atomic layer deposition chamber by sequentially exposing the substrate to a silicon precursor comprising bis(trichlorosilyl)methane and a reactant comprising ammonia to form a film comprising SiCN;
exposing the conformal film to a low temperature steam anneal at a temperature less than or equal to about 400° C. and a partial pressure of water of about 585 Torr to form an annealed conformal film and convert the SiCN to SiOC, the annealed conformal film having a carbon content within ±20% of a carbon content of the conformal film before the low temperature steam anneal;
exposing the substrate with the annealed conformal film to a treatment comprising rapid thermal processing or ashing; and
exposing the treated film to a high temperature anneal at a temperature greater than or equal to about 400° C. to form a film having a wet etch rate in dilute HF less than about 20 Å/min for the first minute, a leakage current less than or equal to about $1.5 \times 10^{-7}$ Å/cm$^2$, and a dielectric constant less than 5,
wherein the conformal film has a thickness in the range of about 10 Å to about 500 Å, and
wherein the annealed conformal film has a substantially uniform composition of carbon, nitrogen and oxygen to film thickness up to about 300 Å, the term "substantially uniform composition" means the composition of the film does not change by more than about 10% relative as a function of depth in the film.

16. A method of depositing a film, the method comprising:
providing a substrate having a substrate surface with a plurality of features formed therein, each feature extending a distance from the substrate surface and having a bottom and at least one sidewall;
forming a conformal oxidation barrier on the substrate surface, the oxidation barrier comprising silicon carbonitride;
forming a conformal film on the substrate surface in an atomic layer deposition chamber by sequentially exposing the substrate to a silicon precursor comprising bis(trichlorosilyl)methane and a reactant comprising ammonia;
exposing the conformal film to a low temperature steam anneal at a temperature less than or equal to about 400° C. and a partial pressure of water of about 585 Torr to form an annealed conformal film, the low temperature steam anneal converting the silicon carbonitride to silicon oxycarbide, the annealed conformal film having a carbon content within ±20% of a carbon content of the conformal film before the low temperature steam anneal;
exposing the substrate with the annealed conformal film to a treatment comprising rapid thermal processing or ashing; and
exposing the treated film to a high temperature anneal at a temperature greater than or equal to about 400° C. to form a film having a dielectric constant less than or equal to about 5
wherein the conformal film has a thickness in the range of about 10 Å to about 500 Å, and wherein the annealed conformal film has a substantially uniform composition of carbon, nitrogen and oxygen to a film thickness up to about 300 Å, the term "substantially uniform composition" means the composition of the film does not change by more than about 10% relative as a function of depth in the film.

* * * * *